INVENTORS
GERALD O. CROWTHER
GRAHAM F. JEYNES
BY
Frank R. Trifari
AGENT

INVENTORS
G. O. CROWTHER
G. F. JEYNES
BY
Frank R. Trifari
AGENT

INVENTORS
GERALD O. CROWTHER
GRAHAM F. JEYNES
BY
Frank R. Trifari
AGENT

United States Patent Office

Re. 26,823
Reissued Mar. 17, 1970

26,823

STEPPING-TUBE COUNTING-CIRCUIT UTILIZING A CONTROL SIGNAL TO PRE-CONDITION INTERSTAGE GATES TO AVOID SIGNAL TIME DELAY

Gerald Offley Crowther and Graham Frank Jeynes, Cheam, England, assignors, by mesne assignments, to U.S. Philips Corporation, New York, N.Y., a corporation of Delaware Original No. 3,303,383, dated Feb. 7, 1967, Ser. No. 331,676, Dec. 19, 1963. Application for reissue Feb. 3, 1969, Ser. No. 802,289
Claims priority, application Great Britain, Dec. 19, 1962, 47,955/62
Int. Cl. H03k *23/38*
U.S. Cl. 315—84.5 5 Claims

Matter enclosed in heavy brackets [ ] appears in the original patent but forms no part of this reissue specification; matter printed in italics indicates the additions made by reissue.

*ABSTRACT OF THE DISCLOSURE*

*A chain of cascade-counting stepping tubes having a two stage gating circuit interconnecting adjacent tubes and responsive to a control pulse and the output of the previous tube for permitting the passage of a guide pulse for setting the next tube.*

Figure 1:
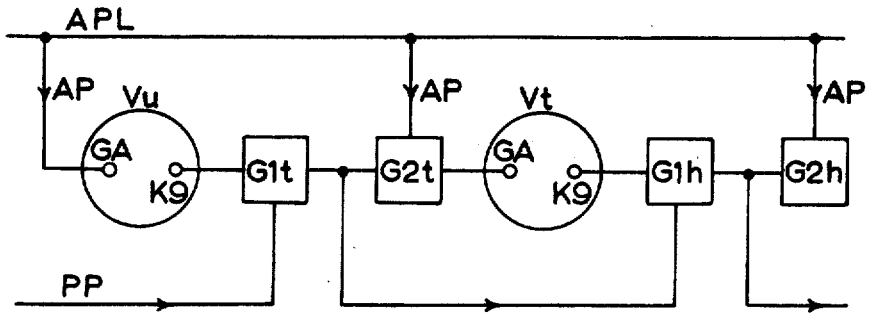

This invention relates to counting circuits and more particularly to cold-cathode stepping-tube counting circuits which may be used in small computing machines.

This invention provides a circuit for stepping a series of such tubes and for controlling the stepping of a higher-order tube in a decade arrangement only when the immediately-preceding tube has reached the count of "nine."

The term "stepping tube" is herein used to define a tube having an electrode assembly comprising a common electrode, a plurality of switching electrodes and a plurality of further electrodes, wherein a stream of electrons and ions may be caused to travel between the common electrode and one of the further electrodes and wherein one end of the sream may be caused to move from one to another of the further electrodes in a predetermined sequence by the application of suitable potentials to the switching electrodes.

Usually the common electrode is circular and functions as an anode, the other electrodes being arranged in a circular row, and when in use, being returned to a potentail more negative than that to which the anode is returned. These other electrodes thus may correctly be regarded as cathodes; however, each position in the tube usually has associated with it three or four of these electrodes and it is convenient to distinguish them by referring to those on which the glow discharge rests between pulses as "main cathodes" or "cathodes" and to refer to the other electrodes as "guide electrodes" or "guides."

In known stepping tubes the transfer of the discharge from its rest position on one cathode to its rest position on the next cathode is thus effected by means of a plurality of guide electrodes; where there are two guide electrodes between adjacent cathodes the guide next to the cathode in the direction of rotation of the discharge is usually termed the "first" or "A" guide and the next guide again in the direction of rotation of the discharge, is termed the "second" or "B" guide. Throughout this specification the terms "A" guide and "B" guide will be used. In these known tubes all the A guides are usually connected together or "commoned" inside the envelope and all the B guides are similarly connected together; in operation the discharge is transferred in its entirety from its rest position on one cathode to an A guide, then from the said A guide to a B guide and finally from the B guide to the next cathode.

In a known type of circuit comprising a chain of cold-cathode stepping tube stages connected in cascade, incoming pulses which are to be "counted" are caused to operate a pulse-generator so as to produce consecutive A and B pulses. In such a circuit it is known to apply pulses to one set of guides in each stage, for instance to supply A pulses to the A guides of all stages, while applying pulses to the other set of guides in each stage only when a control signal appears at the output of the immediately-preceding stage; for example a gate circuit may be controlled by the output condition of a stage so as to allow the next stage to receive a B pulse only when it is desired to "carry" a digit from one stage to the next. Thus in each stage after the first, the tube can only "step" when it receives a B pulse through a gate opened by the preceding stage. A and B pulses are, of course, always applied to the first tube in the chain.

With such an arrangement however there is a delay between the application of a guide pulse—in the above example a B pulse—to one stepping-tube and the opening of the gate which allows the guide pulse also to operate the next stepping-tube; thus there is a delay, relative to the time at which the guide pulse is applied to the first stage in the chain, in the application of the guide pulse to later stages in the chain and this delay increases as the "carry" operation proceeds along the chain. In operating known circuits therefore it has hitherto been necessary to ensure that the duration of the guide pulses is long enough to include this delay in order to ensure operation of the last chain in the stage.

The present invention is an improvement in known arrangements in that each inter-stage gate can be opened by a control pulse which occurs a short time before the arrival of a guide pulse; this means that the guide pulse no longer need be of a duration long enough to include the accumulated delay throughout the chain, because the control pulse can be made to anticipate the guide pulse by a period at least as long as that of the delay to the last tube in the counting chain.

According to one aspect of the invention, the cold-cathode stepping-tube counting-circuit may comprise a chain of cold-cathode stepping tubes with means for applying counting-pulses to the guides of all tubes in the chain. Between each pair of successive stepping-tubes is provided a gate circuit for attenuating the guide-pulses supplied to the second and subsequent tubes in the chain. Each gating circuit can be prevented from performing its attenuating function, and thereby the guide-pulses can be supplied substantially unattenuated to the guides of the respective stepping-tube by applying to the gating circuit a control pulse which starts a short period before the start of a guide-pulse.

Where the counting-circuit employs tubes having more than one guide between successive cathodes, that is to say where the tube is what is known as a "two-guide" or "three-guide" tube, it will be found sufficient to attenuate the pulse of the A guides, because if stepping onto an A guide is prevented then further stepping of the tube is also prevented.

The invention is applicable to tubes of the "single-guide," "two-guide" or "three-guide" type.

According to another aspect of the invention, the cold-cathode stepping tube counting-circuit may comprise a chain of cold-cathode stepping-tubes arranged in cascade with means for applying an output signal from each stepping tube stage except the last of the input of the next succeeding stage so as to provide a "carry" facility. Means are provided for supplying guide pulses to the guides of each stepping-tube so as to permit the discharge to step from one cathode to the next succeeding cathode and thus effect a count. A gating-circuit arrangement is disposed between the output cathode of each stage except the last, and the guides of the next succeeding stage, wherein each gating-circuit is effective to attenuate guide pulses applied to the guides of the respective next succeeding stage. In operation each gating-circuit partly changes its condition when it receives an output signal from the respective output cathode, and completes its change of condition when a pulse is applied to an input terminal of the gating-circuit. This change of condition removes the inhibiting effect of the gate and permits a subsequent guide pulse to be applied to the guides of the next succeeding stepping-tube in a substantially unattenuated form.

Figure 2:
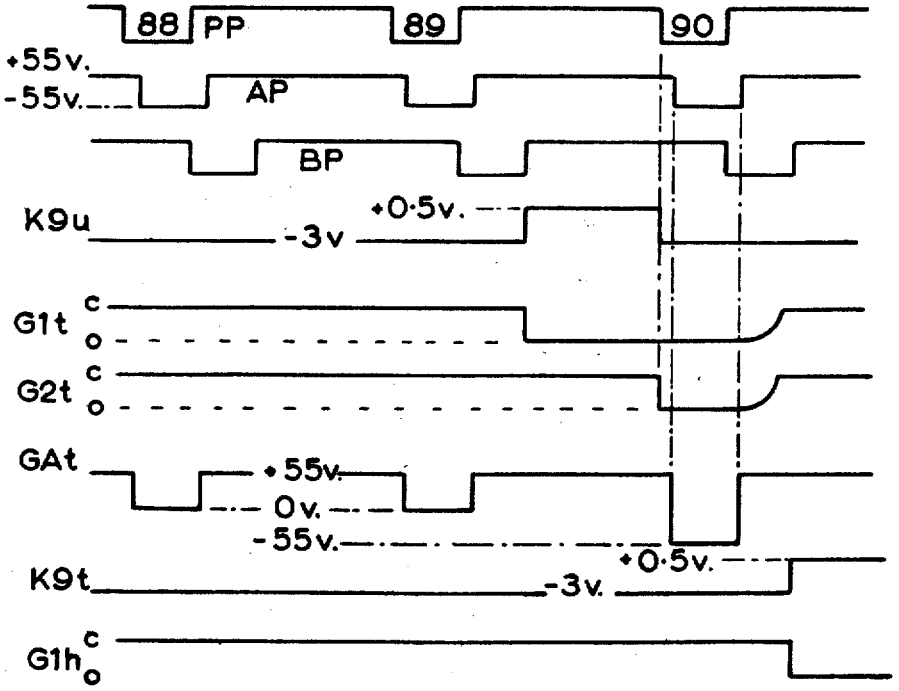
Figure 3:
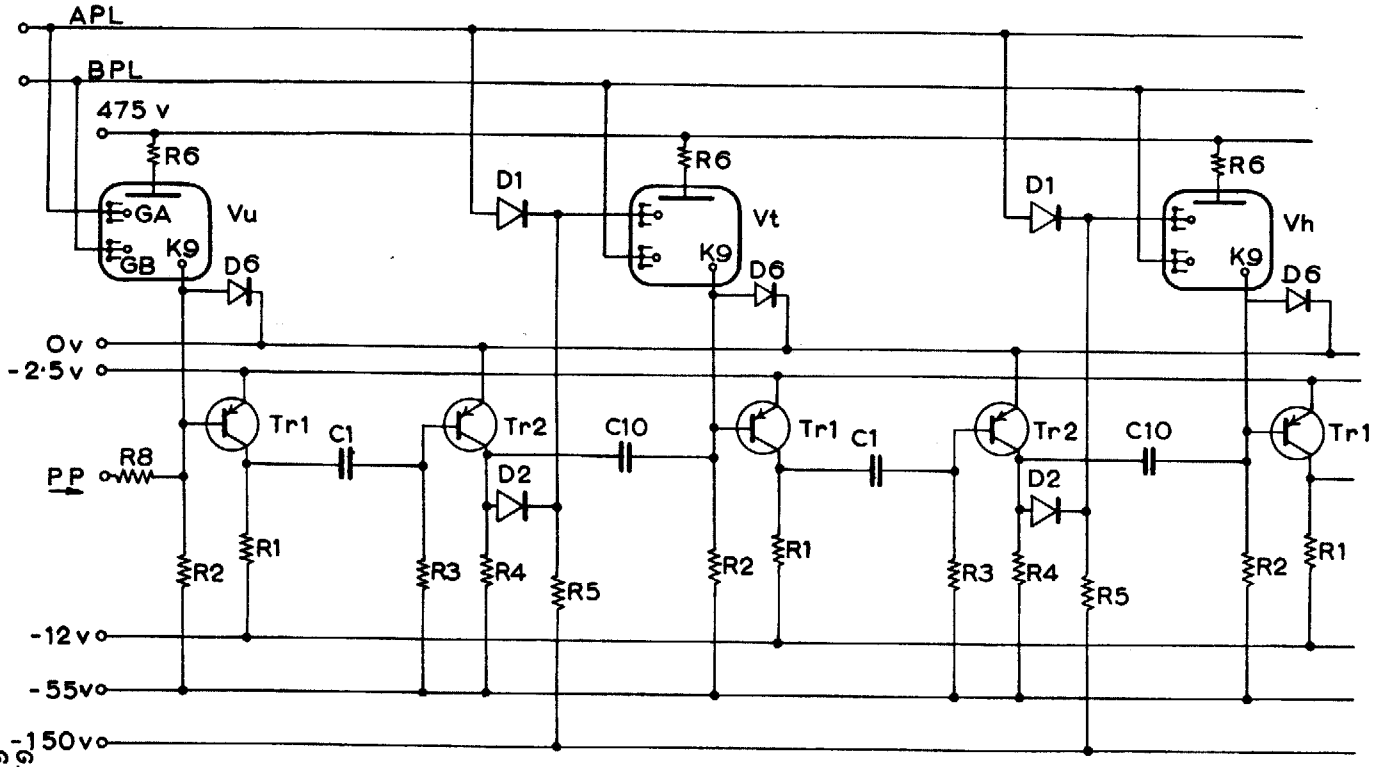
Figure 4:
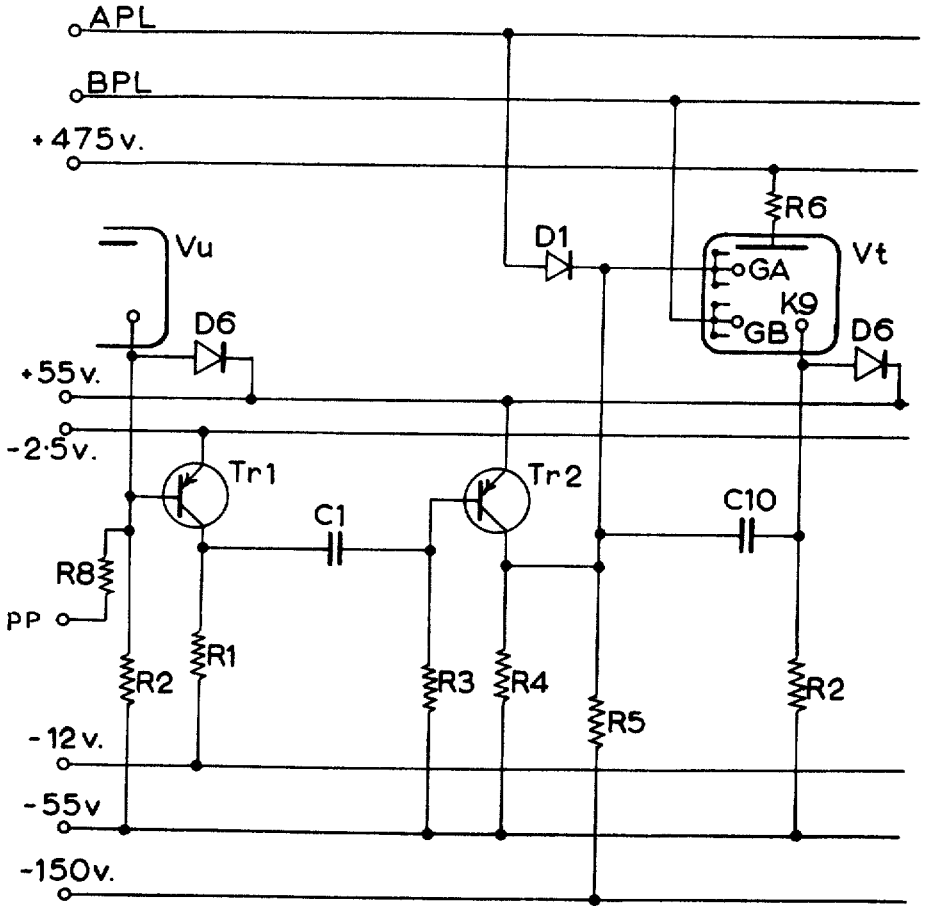

An embodiment of the invention, as applied to counting-tubes of the "two-guide" type, will now be described by way of example with reference to the accompanying diagrammatic drawings wherein FIGURE 1 is a block diagram, FIGURE 2 illustrates wave forms, FIGURE 3 is a circuit diagram and FIGURE 4 is a further circuit diagram.

Referring to FIGURE 1 this illustrates in block diagram form an arrangement of cold-cathode stepping tubes. In this figure are shown the first two decades of a decade series, comprising a "unit" tube Vu and a "tens" tube Vt. "A" pulses AP are applied, in the usual manner, to the "A" guides GA of all the tubes from a common "A" pulse line APL. "B" pulses are also applied to the "B" guides of the tubes, also in the usual manner, not shown in FIGURE 1. "Pre-pulses" PP are also applied to the first of two gates situated between each pair of successive tubes. As shown in the figure these gates [comprising] *comprises* a first gate G1 operated from the ninth cathode K9 of one tube, followed by a second gate G2 the output of which supplies the A guides GA of the succeeding tube. In FIGURE 1 the subscripts u, t and h have been used to indicate the gates preceding the "units," "tens" and the "hundreds" stages respectively. The pre-pulses PP, which may be derived from the same source as the A pulses, are applied to each first gate G1 so as to open this gate when the discharge from the associated stepping-tube is on the ninth cathode of that tube. When this first gate G1 is opened its output is applied to the following second gate G2 and when an A pulse also is applied to this second gate the occurrence of the A pulse shortly after the start of the pre-pulse opens this second gate and causes an A pulse to be applied to the A guides GA of the succeeding tube.

It will thus be seen that the arrangement illustrated in FIGURE 1 provides means whereby, when a first gate is primed by the presence of a positive voltage at the K9 cathode of the associated stepping-tube, the gate is opened by applying a controlling pre-pulse which occurs before the A pulse; this prepares a second gate so that when the A pulse arrives it is applied immediately to the A guides of the next tube. This arrangement differs from previous proposals in that the gate immediately preceding a tube is prepared for opening, not by the pulses from a common A line itself, but by a pulse which occurs a short period before the A pulse.

The timing of these pulses can be more readily appreciated by referring to FIGURE 2 which shows three sets of counting-pulses indicated as 88, 89 and 90, each "set" of pulses comprising a pre-pulse, an A pulse and a B pulse. It will be seen that the A pulses AP are followed, in the usual manner, by B pulses BP which cause the discharge to be successively transferred from a main cathode in the stepping-tube to an A guide, then to a B guide, and finally at the end of a B pulse to the next main cathode in the tube. It will further be seen that the A pulses are preceded by pre-pulses PP and, as will be described hereinafter, these pre-pulses serve to open the gates between successive stepping-tubes. The waveforms shown in FIGURE 2 illustrate the mode of operation of the arrangement shown in block diagram form in FIGURE 1. Although these waveforms are not precisely the same as those which appertain to the specific embodiments described in greater detail with reference to FIGURES 3 and 4, they nevertheless may be regarded as simplified diagrams which illustrate the essential features of the modes of operation of these specific embodiments.

FIGURE 3 is a circuit diagram illustrating a "unit" stage and "tens" stage and part of a "hundreds" stage. The stepping-tubes V of these stages are distinguished by the respective subscripts u, t and h. Each stage comprises a cold-cathode stepping-tube V of the two-guide type and having the ninth cathode K9 brought out separately from the remaining cathodes of the tube. The A guides are all commoned within the tube as are also the B guides; cathodes 1 to 8 and 0 are also commoned. In order to simplify the circuit diagram only the ninth cathode K9 has been shown in each tube.

Each ninth cathode K9 is returned through a 180K ohm resistor R2 to a 55 volt negative line and to this cathode is connected a base of a transistor Tr1, the emitter of which is returned to a 2.5 v. negative line and the collector of which is connected through a load resistor R1 of 5.6K ohms to a 12 v. negative line. The collector of Tr1 is connected through a capacitor C1 of 3.9 nf. to the base of a second transistor Tr2 the emitter of which is connected to a common zero-voltage line and the collector of which is returned through a 10K ohm resistor R4 to the 55 v. negative line. From the collector of Tr2 a diode D2 is connected to the A guides GA of the next following tube and also through a resistor R5 of 180K ohms to an 150 v. negative line. The A guides of this following tube are also connected through a diode D1 to the A pulse Line APL. From the collector of Tr2 a connection is made through a 20 pf. capacitor C10 to the base of Tr1 of the next-following inter-stage gate circuit so as to apply to that next-following gate circuit a negative-going control signal which has the same effect on the next-following gate circuit as does a pre-pulse on the "units" stage. A diode D6 is connected from each cathode K9 to the zero-voltage line so as to limit the positive voltage at the cathodes.

The inter-stage arrangement just described forms two gates; the first gate G1 is formed by the transistor Tr1 while the second gate G2 is formed by transistor Tr2 and the diodes D1 and D2. In operation the transistors can be considered as being in the bottomed condition when the discharge is not resting upon the ninth cathode K9 of the immediately-preceding tube.

Consider now the condition obtaining when a count of "87" is registered in the tubes, that is to say the units tube Vu has its discharge resting in the seventh position on the seventh main cathode and the tens tube has its discharge resting on its eighth main cathode: this is the condition at the beginning of the diagrams shown in FIGURE 2, the gates G1t and G2t and the gate G1h being closed as indicated by the levels C on FIGURE 2. Let now a set of pulses, the eighty-eighth occur. First of all the pre-pulse PP is applied through a 100K ohm resistor R8 to the cathode K9 of the units tube and also to the base of the transistor Tr1 connected to this stage. As stated previously when the discharge is not on the ninth cathode of a stage the transistors Tr1 and Tr2 following this stage are heavily-conducting and are bottomed; in this condition the collector of Tr1 is at very nearly the voltage of the emitter, for example approximately 3.0 v. negative and its base is at approximately the same voltage. Similarly the base of Tr2 will be between 0.5 and 1 volt negative whilst the collector of this transistor will be at approximately 0.5 volt negative. Thus capacitor C1 is charged to about 2 volts with its left-hand terminal negative. When a negative-going pre-pulse of an amplitude of for instance 50 to 60 volts is applied through R8 to the base of Tr1, it will have little effect as not only is this transistor already bottomed and therefore cannot be driven further into conduction but also the conducting base-emitter diode of the transistor results in all the pulse voltage appearing across R8; the gating circuits therefor do not change their condition. Shortly after the occurrence of the negative-going leading edge of the eighty-eighth pre-pulse, the eighty-eighth A pulse is applied from the A pulse line APL to the A guides GA of the tube Vu and this causes the discharge on the seventh main cathode of that tube to step off that cathode onto the eighth guide GA. After a short delay the eighty-eighth B pulse is applied from the B pulse line BPL to the B guides GB and the discharge is stepped to the eighth B giude of the tube. During both these stepping operations the voltage at the ninth cathode K9 of the tube remains clamped at −3 v. by the emitter-base diode of Tr1 and no change occurs in any of the gates. At the end of the eighty-eighth B plus the discharge steps off the eighth B guide on at the eighth main cathode. When the eighty-ninth pulse arrives, the discharge steps first of all onto the eighty-ninth A guide, then onto the eighty-ninth B guide, and finally at the end of the eighty-ninth B pulse onto the ninth cathode of the tube Vu. When the discharge steps into the ninth cathode of Vu then the voltage at this cathode rises due to the voltage drop produced across R2 by the current flowing through the tube Vu: this voltage rises to about 0.5 v. positive, where it is clamped by diode D6 of FIGURE 3, as shown on diagram K9u on FIGURE 2. This voltage rise at the base of Tr1 causes the transistor to be cut off. When Tr1 cuts off, its collector voltage is no longer held to within a volt or so of its emitter voltage by the collector current and the collector of Tr1 therefore seeks to drop to −12 v. C1, the left-hand side of which as viewed in FIGURE 3 is returned through R1 to −12 volts and the right-hand side of which is held at approximately −1 volt by the emitter-base diode of Tr2, now commences to charge with a time-constant C1R1 through the emitter-base junction of Tr2 to the difference between the normal bottomed base voltage of Tr2 and the 12 volt negative line, that is to say with its right-hand terminal at about 11 volts positive with respect to its left-hand terminal. As Tr2 is already bottomed its collector current is substantially unaffected by this charging current of C1. The gate formed by transistor Tr1 is now open as indicated by the level 0 in FIGURE 2 and is in such a condition that the application of a negative-going pulse to Tr1 will cause that transistor to conduct and to pass a positive-going pulse on to Tr2: such a pulse applied to the base of Tr2 would then cut off Tr2. Thus, the positive voltage to which K9 has been raised acts to open the gate G1t formed by the transistor Tr1 and this gate is now in an "open" condition in which it will respond to the next negative-going pre-pulse applied through R8.

When the ninetieth pre-pulse is applied through R8 then it carries the base of Tr1 negative and Tr1 conducts very heavy causing its collector voltage to rise towards its emitter voltage; this positive-going rise is applied through C1 to the base of Tr2 which is cut off, since C1 is by now assumed to have acquired a substantial proportion of its 11 volt charge described above, and this cutting-off of Tr2 opens gate G2h as indicated by the level 0 in FIGURE 2. When Tr2 cuts off its collector is no longer held at approximately 1 volt negative but travels down to −55 volts, that it to say the voltage to which its collector is returned through R4, and this negative-going step is applied through C10 to the base of Tr1 of the next following gate. The negative-going step will however, not substantially affect the transistor Tr1 of this next-following gate as it is already bottomed and the conditions are to all intents and purposes the same as those already described in connection with the application of the eighty-eighth pre-pulse through R8 to the cathode K9 of the units tube Vu.

Let us now consider the operation of diodes D1 and D2 in the guide A circuit of the tube Vt. When the collector of Tr2 is at or near zero volts then negative-going A pulses from the A pulse line are limited by diode D2 and the guides GA of Vt are inhibited from going more negative than the voltage of the collector of Tr2. However, when Tr2 is cut off then D2 is returned not to a voltage which is only slightly less than zero but to the voltage of the negative line, that is to say −55 volts, to which R4 is connected. D2 therefore will now only limit negative-going pulses below −55 volts so that gate G2t is now "open" and substantially a full negative-going A pulse can now appear at the A guides of Vt; this is sufficient to step the discharge in Vt, from whatever main cathode is it on, to the next succeeding A guide.

It will thus be seen that the first gate, comprising transistor Tr1 is open when the discharge comes to rest on K9 of Vu, whilst the second gate comprising transistor Tr2 and diodes D1 and D2 is opened by a pre-pulse applied through Tr1 and C1 before the A pulse is applied through the A pulse line: thus the opening of the gates between the two tubes is not dependent upon receipt at the second tube of the A pulses, but depends upon the coincidence of a discharge upon K9 of the first tube and the application of a pre-pulse to the first gate, so that both gates are opened before the A pulses are applied to the second tube.

This is illustrated in FIGURE 2 where it will be seen that the rise of voltage of K9u, that is to say K9 of the "units" tube Vu, opens G1t, that is to say the first gate of the "tens" tube Vt. Upon receipt of the next, that is to say the ninetieth, pre-pulse the discharge still rests on K9u but the negative-going pre-pulse applied through R8 to the base of Tr1 forces this transistor into conduction and opens G2t as shown in FIGURE 2. When the discharge moves off K9u G2t remains open because the left-hand terminal of C1 has been carried suddenly positive by the leading edge of the pre-pulse and therefore the right-hand terminal, which is now some 10 or 11 volts positive with respect to the left-hand terminal, has also been carried positive, since the capacitor cannot alter its voltage instantaneously. Thus although the discharge has moved off K9u and transistor Tr1 is conducting, Tr2 is still cut off, capacitor C1 discharges through R3; the time taken for C1 to discharge would at first sight appear to be given by the time-constant C1.R3 but in fact this time-constant is considerably reduced by hole-storage current flowing through C1 and R4. The gate G2t remains in an open condition until the voltage across capacitor C1 is returned to about 2 volts. Consequently the collector of Tr2 is still substantially at the potential of the 55 volt negative line and the gate formed by transistor Tr2 and diodes D1 and D2 is sensitive to the next A pulse applied along the A pulse line. The time taken for C1 to discharge must be long enough to maintain gate G2 open for the whole duration of the A pulse but must be short enough to ensure that this gate is closed before the arrival of the next A pulse.

When this next A pulse arrives it therefore can carry negatively the A guides of Vt. The voltage at the A guides of tube Vt is shown at GAt in FIGURE 2. At the end of the pre-pulse Tr1 does not alter its condition since it has already been bottomed by the leading edge of the pre-pulse and by the subsequent removal from its base of the positive voltage appearing at K9 of Vu. However, C1 takes some time to lose its charge and with suitable dimensioning of C1 and R3 the voltage at the right-hand terminal of C1 can be made to maintain Tr2 in its cut off condition for some time after the end of the A pulse. Finally C1 loses its charge to such an extent that the base of Tr2 becomes negative with respect to its emitter and Tr2 starts to conduct; conduction of Tr2 rapidly clamps C1 to what may be termed its "normal" voltage of approximately 2 volts by completing its discharge through the emitter-base junction of Tr2 and gate G2t closes as diagrammatically illustrated in FIGURE 2.

At the end of the ninetieth B pulse the discharge will transfer to the ninth cathode of Vt and the first gate G1h associated with the "hundreds" stage will open as shown on the last two diagrams of FIGURE 2.

The ninety-first to ninety-eighth pulses will step tube Vu but although gate G1h is open the gates G1t and G2t are closed and therefore the succeeding counting stages will be unaffected. The ninety-ninth pulse will again open gate G1t and the hundredth pre-pulse will open gate G2t causing it to permit an A pulse to be applied in full to tube Vt, and also causing it to apply a negative-going step to the base of transistor Tr1 of G1h. As G1h is now open, because the discharge of Vt is on the ninth position, the negative-going step applied through C10 will open gate G2h and therefore the hundredth A pulse can now be applied in full to the tube Vh, as well as to the tube Vt. At the end of the hundredth B pulse the discharges in Vu and Vt will transfer to their zero cathodes and the discharge in Vh will transfer to its first cathode, and all gates will be closed.

With the embodiment described with reference to FIGURE 3, the presence of diode D2 prevents the A guides of the following stepping tube from falling below the collector voltage of the transistor when the transistor is bottomed. This means that when an A pulse is applied through D1 to the A guides of the stepping-tube the voltage at these guides falls from 55 v. positive to approximately zero volts, but this voltage drop of approximately 55 v. is insufficient to step the discharge off the relevant A guide. When transistor Tr2 is non-conducting that is to say when the second gate is open, its collector is at a negative voltage of 55 v. so that diode D2 now only limits below that voltage and therefore allows the whole of the negative-going A pulse to be applied to the A guides. This is illustrated in FIGURE 2 where it will be noted that when the discharge steps off K9 of the units tube the guides A of the tens tube fall to −55 v. with the applied A pulses, whilst for the other two pulses they fall only to zero volts.

In FIGURE 2 the length, that is to say the duration, of each pre-pulse has been illustrated as being the same as the length of the A and B pulses. This is not essential however and in the circuits described with reference to FIGURES 3 and 4 the pre-pulse may in fact terminate at any time after the discharge has started to transfer to the appropriate A guide, that is to say at any time after the start of the associated negative-going A pulse.

FIGURE 4 illustrates a second embodiment which employs a "high-voltage" transistor for Tr2. The emitter of Tr2 in this embodiment is returned not to the zero-voltage line but to a 55 v. positive line so that the emitter-collector voltage of this transistor is some 110 v. whereas that of the transistor Tr2 in FIGURE 3 is only some 55 v. In this embodiment, as the collector of Tr2 now has a voltage excursion of 110 v., that is to say +55 v. and −55 v., when Tr2 is conducting its collector is only a volt or so below 55 v. positive and this voltage at the collector will hold the A guides of Vt at that voltage by applying a bias to the right-hand side of D1 as viewed in FIGURE 5 so that D1 will not conduct when the voltage on the A pulse line falls below the collector voltage of Tr2.

In the embodiment described above the pre-pulses precede the A pulses; in a modification separate pre-pulses are not provided and pulses from the A pulse line are employed instead, so that the control pulses and the A pulses start together.

What we claim is:

1. A cold cathode stepping tube counting chain comprising, a plurality of gaseous discharge tubes arranged in a cascade of successively higher order stages, each of said tubes having a plurality of successively higher order representation cathodes and at least one cycling terminal for successively switching the said discharge along the respective order cathodes in ascending order, means applying a cycling pulse to the cycling terminal of the first of said stages, gating means interconnecting the cycling terminal of each subsequently higher order stage with the highest order cathode terminal of each preceding stage, each of said gating means including first and second coincident input gating stages, means applying a control pulse to an input of the first gating stage of the lowest order stage gating means, means connecting the output of each of the first gating stage portions of each of said gating means to an input of the next higher order first gating stage portion of each of said gating means, and means connecting said means applying a cycling pulse to an input of each of the second stage portions of each of said gating means.

2. The combination of claim 1 wherein said tubes include first and second guides coupled to each of said cathodes, said cyling terminal being coupled to one of said guides, and means for applying further pulses to the other of said guides.

3. A cold cathode stepping tube counting chain comprising, a plurality of gaseous discharge tubes arranged in a cascade of successively higher order stages, each of said tubes having a plurality of successively higher order representation cathodes and at least one cycling terminal for successively switching the said discharge along the respective order cathodes in ascending order, means applying a cycling pulse to the cycling terminal of the first of said stages, gating means interconnecting the cycling terminal of each subsequently higher order stage with the highest order cathode terminal of each preceding stage, said gating means including an input terminal for receiving control pulses, a first transistor having input, output and common electrodes, said input electrode being coupled to said terminal and to said highest order cathode of each of said stages but the last, a second transistor having input, output and common electrodes, the input electrode of said second transistor coupled to the output electrode of said first transistor, means coupling the common electrodes of both first and second transistors to a reference point, a first diode coupling the output electrode of said second transistor to the cycling terminal of the next successive stage in ascending order, a second diode coupling said means applying a cycling pulse to the cycling terminal of said next successive stage, and means for biasing said diodes such that a pulse will reach the cycling terminal of said next successive stage upon the coincidence of first and second pulses to said first and second diodes.

4. The combination of claim 3 further including capacitive means coupling the output electrode of said second transistor to the input terminal of the next successive gating means in ascending order.

5. The combination of claim 3 wherein the common electrode of said first and second transistors are each coupled to a different reference point.

References Cited

The following references, cited by the Examiner, are of record in the patented file of this patent or the original patent.

UNITED STATES PATENTS

| | | | |
|---|---|---|---|
| 2,714,179 | 7/1955 | Thomas et al. | 315—84.6 |
| 2,975,329 | 3/1961 | Irving et al. | 315—84.6 |
| 3,168,677 | 2/1965 | Somlyody | 315—84.6 |

ROBERT SEGAL, Primary Examiner

U.S. Cl. X.R.

328—51, 72